(12) United States Patent
Yamaguchi et al.

(10) Patent No.: US 9,109,303 B2
(45) Date of Patent: Aug. 18, 2015

(54) SUSCEPTOR AND VAPOR-PHASE GROWTH APPARATUS

(71) Applicants: TAIYO NIPPON SANSO CORPORATION, Tokyo (JP); TN EMC LTD., Tokyo (JP)

(72) Inventors: Akira Yamaguchi, Tokyo (JP); Kosuke Uchiyama, Tama (JP)

(73) Assignees: TAIYO NIPPON SANSO CORPORATION, Tokyo (JP); TN EMC LTD., Tokyo (JP)

( * ) Notice: Subject to any disclaimer, the term of this patent is extended or adjusted under 35 U.S.C. 154(b) by 0 days.

(21) Appl. No.: 13/932,346

(22) Filed: Jul. 1, 2013

(65) Prior Publication Data
US 2014/0007815 A1     Jan. 9, 2014

(30) Foreign Application Priority Data
Jul. 6, 2012   (JP) .................................. 2012-151967

(51) Int. Cl.
*C30B 25/12*     (2006.01)
*C23C 14/50*     (2006.01)
*C23C 16/458*    (2006.01)

(52) U.S. Cl.
CPC ............. *C30B 25/12* (2013.01); *C23C 14/505* (2013.01); *C23C 16/4584* (2013.01); *C23C 14/50* (2013.01); *C23C 16/458* (2013.01); *C23C 16/4583* (2013.01)

(58) Field of Classification Search
CPC .... C23C 14/505; C23C 16/4584; C30B 25/12
USPC .............................. 156/345.51; 118/728, 729
See application file for complete search history.

(56) References Cited

U.S. PATENT DOCUMENTS

| 4,386,255 A * | 5/1983 | Berkman et al. .............. 219/634 |
| 5,377,816 A * | 1/1995 | Deligi et al. .................. 198/619 |
| 8,371,567 B2 * | 2/2013 | Angelov et al. ............ 269/289 R |
| 2004/0123952 A1 * | 7/2004 | Hur et al. .................. 156/345.31 |
| 2007/0095286 A1 * | 5/2007 | Baek et al. ..................... 118/719 |
| 2007/0218702 A1 * | 9/2007 | Shimizu et al. ............... 438/758 |
| 2010/0034624 A1 * | 2/2010 | Kishimoto et al. ....... 414/225.01 |

FOREIGN PATENT DOCUMENTS

JP    2000-012470    1/2000

* cited by examiner

*Primary Examiner* — Gordon R Baldwin
*Assistant Examiner* — Aiden Lee
(74) *Attorney, Agent, or Firm* — Nixon & Vanderhye P.C.

(57) ABSTRACT

The present invention provides a susceptor which is rotatably provided in a chamber and has a plurality of substrate mounting parts, and a substrate on which a thin film is deposited is rotatably mounted on the substrate mounting part, and
the susceptor has a disk-shape wherein there is an opening at an inner periphery of the susceptor, into which a rotating shaft to rotate the susceptor is inserted, and the susceptor has a plurality of notches extending in a radial direction at an outer periphery and/or a periphery of said opening.

11 Claims, 3 Drawing Sheets

SUSCEPTOR AND VAPOR-PHASE GROWTH APPARATUS

TECHNICAL FIELD

The present invention relates to a vapor-phase growth apparatus which supplies a vapor-phase raw material onto substrates while heating a plurality of rotating and revolving substrates, to thereby grow a thin film.

Priority is claimed on Japanese Patent Application No. 2012-151967, filed on Jul. 6, 2012, the content of which is incorporated herein by reference.

BACKGROUND ART

In an epitaxial growth method which grows a semiconductor thin film on a semiconductor substrate, raw material gas is supplied into a high-temperature reactor, and a thin film is grown by thermal decomposition and vapor-phase reaction. In a vapor-phase growth apparatus which is an apparatus for executing the epitaxial growth method, since a substrate is mounted on a susceptor, and heating is performed from the lower surface side of the susceptor to heat the substrate to a high temperature, the lower surface side of the susceptor is raised to a high temperature. The term "susceptor" refers to a support on which a plurality of substrates can be mounted on the upper surface thereof, and which is heated and transmits heat to the substrates.

In addition, since raw material gas flows on the upper surface side of the susceptor, the upper surface side of the susceptor is deprived of heat by raw material gas.

For this reason, a difference in temperature occurs between the upper surface side and the lower surface side of the susceptor, thermal stress occurs in the susceptor, and cracking or fracture occurs in the susceptor.

In order to solve this problem, for example, in Patent Document 1, a skirt portion which hangs down on an outer periphery of a susceptor is provided, a minute gap is provided at the outer periphery of the susceptor between a ring arranged near the susceptor and the skirt portion, and the upper space and the lower space of the susceptor communicate with each other by the minute gap.

Accordingly, a temperature deviation above and below the outer periphery of the susceptor is eliminated, and there is no case where cracking or fracture occurs.

DOCUMENTS OF RELATED ART

Patent Documents

[Patent Document 1] Japanese Unexamined Patent Application, First Publication No. 2000-12470

DISCLOSURE OF THE INVENTION

Problems to be Solved by the Invention

In recent years, in order to process multiple substrates at a time, a susceptor on which the substrates are mounted tends to increase in size. In order to grow a uniform thin film on a plurality of substrates mounted on the susceptor, a so-called rotating and revolving vapor-phase growth apparatus which revolves the susceptor and rotates the substrates is manufactured.

The susceptor of the rotating and revolving vapor-phase growth apparatus has a complicated shape wherein there is an opening at the center thereof, into which a rotating shaft is inserted, and a plurality of substrate mounting parts having an opening provided in a circumferential direction between the central opening and the outer periphery.

When a raw material gas supply port is provided at the inner periphery of the susceptor, in order to suppress vapor-phase reaction before raw material gas reaches the substrate, the temperature of the inner periphery of the susceptor is lowered. The outer periphery of the susceptor becomes a space which guides exhaust gas to an exhaust line, gas should be cooled to be equal to or lower than a heatproof temperature of the exhaust line, and the temperature of the outer periphery of the susceptor is set to be lowered.

In this way, since an intermediate portion close to the substrate mounting part of the susceptor reaches a comparatively high temperature, and in contrast, the inner periphery and the outer periphery of the susceptor reach a comparatively low temperature, the susceptor undergoes a difference in temperature in a radial direction.

Since a large-sized susceptor has a complicated shape, and the susceptor is mounted in an environment in which a difference in temperature occurs in the radial direction as well as between the upper and lower surfaces, a temperature distribution occurs, causing the occurrence of cracking or fracture.

In order to prevent the occurrence of cracking or fracture, for example, even if the method described in Patent Document 1 is introduced, the susceptor of Patent Document 1 can be applied only to a small-sized susceptor on which a single substrate is mounted, and cannot be applied to a large-sized susceptor.

Although the method of Patent Document 1 is provided with the skirt portion at the outer periphery of the susceptor, if the skirt portion is provided in a large-sized susceptor, the susceptor should be produced as a thick single object. However, usually, since the susceptor is cut out from a block, such as carbon, unrealistically, after a large number of members are secured, cutting allowance increases, and cost increases.

The invention has been accomplished in order to solve this problem, and an object of the invention is to provide a susceptor which has a substrate mounting part, on which a plurality of substrates are mounted, and in which there is no cracking due to a temperature distribution, and a vapor-phase growth apparatus having the susceptor.

Means to Solve the problems

An object of the invention can be attained by (1) to (5).

(1) A susceptor which is rotatably provided in a chamber and has a plurality of substrate mounting parts, and a substrate on which a thin film is deposited is rotatably mounted on the substrate mounting part, and the susceptor has a disk-shape wherein there is an opening at an inner periphery of the susceptor, into which a rotating shaft to rotate the susceptor is inserted, and the susceptor has a plurality of notches extending in a radial direction at an outer periphery and/or a periphery of said opening.

(2) The susceptor described in (1), in which the notches are provided between the substrate mounting parts.

(3) The susceptor described in (1) or (2), in which the notches are provided at the outer periphery of the susceptor, and a circular hole is provided in each notch provided at the outer periphery.

(4) A vapor-phase growth apparatus including the susceptor described in any one of (1) to (3).

(5) The vapor-phase growth apparatus with the susceptor described in (3), in which the vapor-phase growth apparatus has a susceptor cover provided on an upper surface of the susceptor, and a thrust-up mechanism having a thrust-up rod provided below the susceptor to be insertable into the circular hole and movable up and down, and the susceptor cover is able to be thrust up by the thrust-up rod.

Effect of the Invention

In the invention, since the susceptor has a disk-shape wherein there is an opening at an inner periphery of the susceptor, into which a rotating shaft to rotate the susceptor is inserted, and the susceptor has a plurality of notches extending in a radial direction at an outer periphery and/or a periphery of said opening, the cost is low, cracking does not easily occur in the susceptor even if there is a difference in temperature within a plane, and it is possible to prevent a decrease in the life of the susceptor.

BEST MODE FOR CARRYING OUT THE INVENTION

Hereinafter, although a preferred example of the invention will be described, the invention is not limited to this example. Additions, omissions, substitutions, and other alterations of configurations may be made within the scope without departing from the spirit of the invention.

Figure 2:
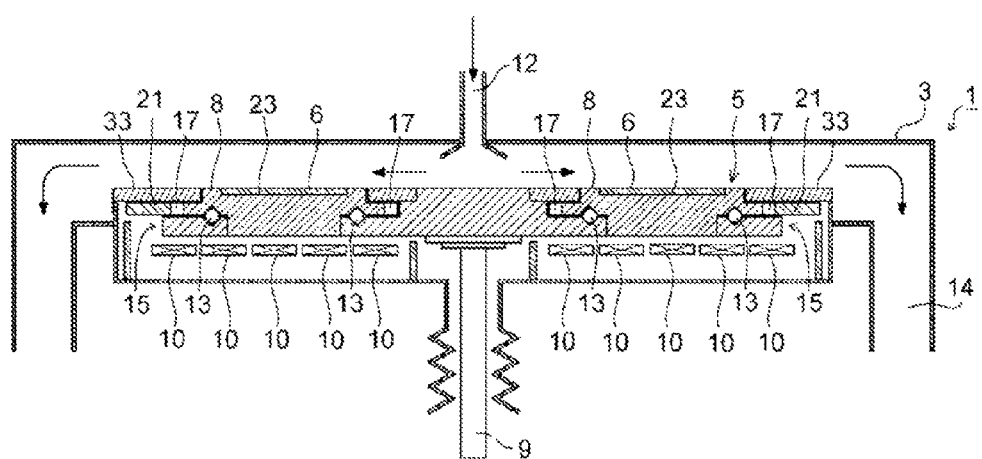
FIG. 2 is a sectional elevational view of a vapor-phase growth apparatus having a susceptor according to an embodiment of the invention.

As shown in FIG. 2, a vapor-phase growth apparatus 1 according to an embodiment of the invention is a rotating and revolving vapor-phase growth apparatus in which a disk-like susceptor 5 is rotatably provided in a flat cylindrical chamber 3, and a plurality of substrate mounting parts 8 rotatably provided at an outer periphery of the susceptor 5, a substrate 6 on which a thin film is grown being mounted on the substrate mounting part 8.

At the center of the chamber 3, a rotating shaft 9 which passes through a bottom portion of the chamber 3 and rotatably supports the susceptor 5 is provided.

In a lower portion of the chamber 3, heaters 10 as heating means are provided. As shown in FIG. 2, since the substrate mounting parts 8 have a lower surface expose to the heaters 10 and can receive radiation directly from the heater 10, heat can be efficiently transmitted to the substrate 6. The heating means may be a lamp or the like.

In the central portion on the surface of the susceptor 5 of the chamber 3, a raw material gas introduction portion 12 is provided to introduce raw material gas (for example, trimethylgalium and ammonia), and an exhaust portion 14 is provided at the outer periphery.

Hereinafter, the susceptor 5 which is a feature of the invention will be described in detail referring to FIGS. 1 and 2.

<Susceptor>

Figure 1:
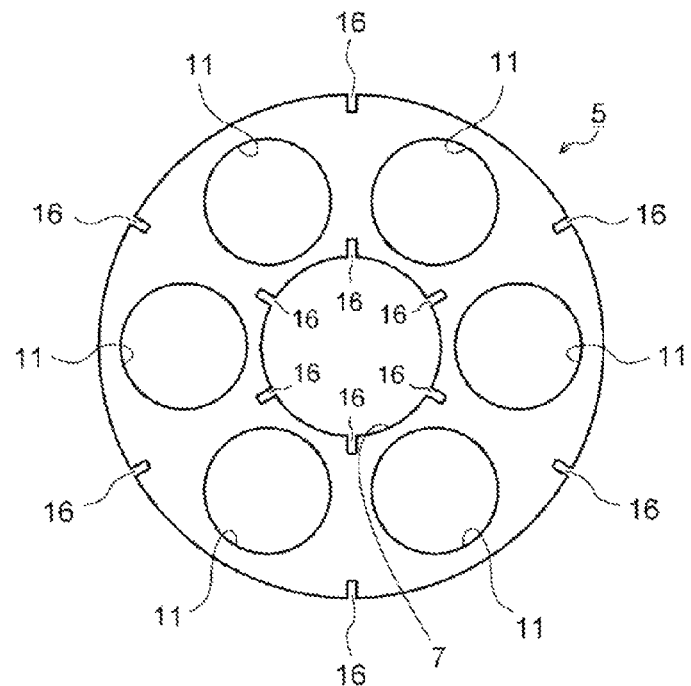
FIG. 1 is a plan view of a susceptor according to an embodiment of the invention.

As shown in FIG. 1, the susceptor 5 has a disk-shape wherein there is an opening 7 at the inner periphery of the susceptor 5, into which the rotating shaft 9 to rotate the susceptor 5 is inserted.

The susceptor 5 is made of a good conductor of heat, such as carbon, and is coated with SiC or the like in order to prevent corrosion by raw material gas.

In the periphery of the opening 7, six circular openings 11 for providing the substrate mounting parts 8 are provided. On the outer periphery of the opening 11, a ball bearing mechanism 15 having carbon or ceramic balls 13 is provided (see FIG. 2).

In the opening 11, the disk-like substrate mounting part 8 having a gear 17 at the outer periphery is rotatably provided. The substrate mounting part 8 is provided through the ball bearing mechanism 15, thereby stably rotating the substrate mounting part 8 at high temperature.

As shown in FIG. 1, the susceptor 5 is provided with six notches 16 extending by a predetermined length in a radial direction between adjacent openings 11 on the outer periphery of the susceptor 5. Similarly, six notches 16 are provided at the periphery of the opening 7 at the center of the susceptor 5.

Although the longer the length of the notch 16, the higher the effect of relaxing internal stress, if the notch 16 is too long, fracture easily occurs due to the weight of the susceptor or impact at the time of conveying. For this reason, the notch 16 is set to an approach length according to the balance of the effect of relaxing internal stress and the occurrence of fracture. The length of the notch 16 is preferably 1 to 20 mm, and more preferably, 3 to 10 mm.

In this way, if the notches 16 are provided, it is possible to relax internal stress (thermal stress) occurring when the susceptor 5 reaches high temperature.

A state where the above-described susceptor 5 is provided in the chamber 3 will be described referring to FIG. 2.

As shown in FIG. 2, an upper portion of the rotating shaft 9 is detachably inserted into the opening 7 of the susceptor 5. When this happens, the susceptor 5 is rotatably provided in the chamber 3.

The gear 17 of the substrate mounting part 8 is meshed with a fixed gear 21 provided on the outer periphery, and if the susceptor 5 is rotated, the substrate mounting part 8 obtains a reaction force from the fixed gear 21 and rotates. A moving gear may be provided instead of the fixed gear 21, and the substrate mounting part 8 may be rotated by the moving gear.

The substrate 6 is mounted in a pocket 23 provided in a circular shape in the upper surface of the substrate mounting part 8. Accordingly, if the substrate mounting part 8 rotates, the substrate 6 also rotates. If the susceptor 5 is rotated, the substrate 6 revolves around the rotating shaft 9 and thus rotates and revolves.

As shown in FIG. 2, the susceptor 5 is provided with a disk-like susceptor cover 33 which covers the upper surface of the susceptor 5, thereby preventing the susceptor 5 from being contaminated by product materials to be generated at the time of vapor-phase growth. Hereinafter, the susceptor cover 33 will be described in detail.

<Susceptor Cover>

The susceptor cover 33 is made of the same member as the susceptor 5 or an optimum member taking into consideration tolerance of conveying or cleaning.

The susceptor cover 33 has a shape slightly greater than the susceptor 5, and a conveying arm or the like slides below a protruding portion and is lifted up, thereby discharging the susceptor cover 33 only. In this way, only the contaminated susceptor cover 33 can be replaced after film formation, and it is not necessary to replace the heavy susceptor 5. The susceptor cover 33 has also an effect of reducing the amount of moisture to be absorbed when the susceptor 5 is exposed to the atmosphere.

Since the susceptor cover 33 covers the notches 16, raw material gas does not flow from the notches 16 toward the heaters 10.

In the vapor-phase growth apparatus 1 of FIG. 2, although the substrate 6 is provided on the susceptor 5, and a growth surface becomes the upper side of the substrate 6 (face-up type), from the viewpoint of preventing sticking of dust, the substrate 6 may be provided on the lower surface of the susceptor 5, and a growth surface becomes the lower surface of the substrate 6.

A method of vapor-growing a thin film using the vapor-phase growth apparatus 1 of this embodiment configured as above will be described.

First, in a state where the susceptor 5 on which the substrate 6 is mounted through the substrate mounting part 8 is provided in the chamber 3, the rotating shaft 9 is rotated to rotate the susceptor 5. If the susceptor 5 rotates, the substrate 6 mounted on the substrate mounting part 8 rotates and revolves.

The heater 10 is operated to heat the substrate 6 to a predetermined temperature through the susceptor 5 and the substrate mounting part 8. At this time, since the susceptor 5 has the notches 16 in the radial direction, it is possible to relax internal stress caused by heating and to prevent the susceptor 5 from being fractured or cracked.

In a state where heating is performed, as indicated by an arrow in FIG. 2, raw material gas is introduced from the raw material gas introduction portion 12. Raw material gas is thermally decomposed on the susceptor 5 heated to high temperature, and when raw material gas passes above the substrate 6, decomposed gas molecules are deposited on the upper surface of the substrate 6, thereby performing film formation. At this time, since the substrate 6 rotates and revolves, the film thickness is averaged. Raw material gas passes through the substrate 6 is exhausted as exhaust gas from the exhaust portion 14.

As a method of recovering the substrate 6 with the film formed thereon, there is a method in which only the substrate 6 is lifted up from the susceptor 5 and recovered, a method in which the substrates 6 together with the susceptor 5 are carried into a separate chamber, and the substrates 6 are transferred from the susceptor 5 to a cassette container capable of accommodating multiple substrates 6 at a time manually or automatically and recovered, or the like.

As described above, in this embodiment, a plurality of notches 16 extending in the radial direction are provided at the outer periphery of the susceptor 5 and at the periphery of the opening 7. Accordingly, it is possible to relax internal stress caused by heating, and to prevent the susceptor 5 from being fractured or cracked. Therefore, the cost is low, cracking does not easily occur in the susceptor 5 even if there is a difference in temperature within a plane, and it is possible to prevent a decrease in the life of the susceptor 5.

The shape or position of the notch 16 is not limited to that described above. As a form different from the susceptor 5, for example, there is a susceptor 51 shown in FIG. 3.

Figure 3:
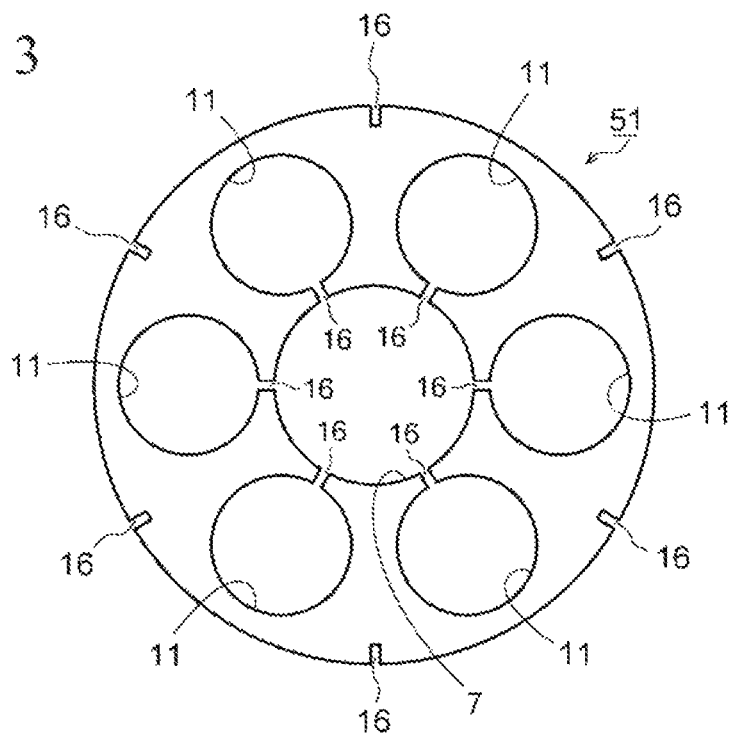
FIG. 3 is a plan view of a susceptor of another form of the susceptor of FIG. 1.

In the susceptor 51, as shown in FIG. 3, the position of the notch 16 provided at the periphery of the opening 7 of the susceptor 1 is changed so as to communicate the opening 7 and the opening 11 for the substrate mounting part 8. In this way, since the opening 11 also can play a role of relaxing stress, and the length can be secured compared to the susceptor 1, it is possible to obtain a high stress relaxation effect.

Figure 6:
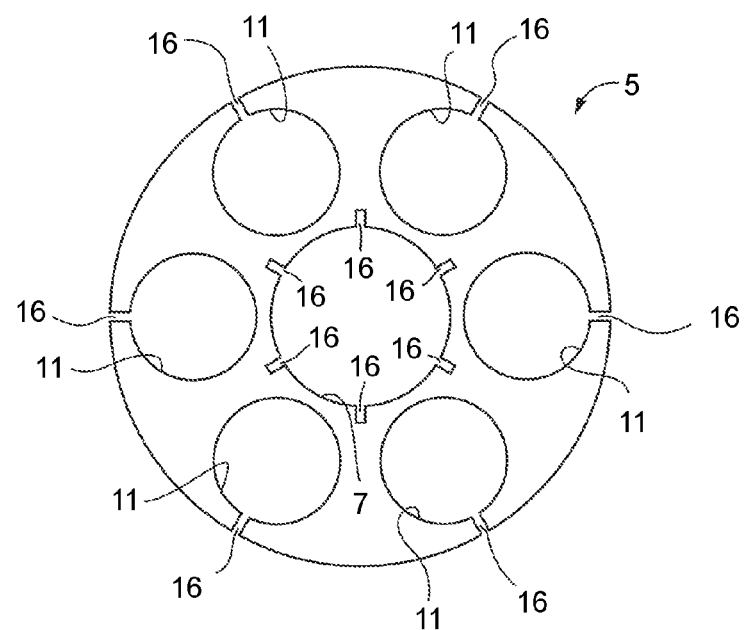
FIG. 6 is a plan view of a susceptor of another form other than the susceptors of FIGS. 1, 3 and 4.

As another form of the susceptor 51, the position of the notch 16 at the periphery of the opening 7 may be the same as the susceptor 1, and the position of the notch 16 at the outer periphery may be changed so as to communicate with the opening 11, as illustrated in FIG. 6.

Figure 4:
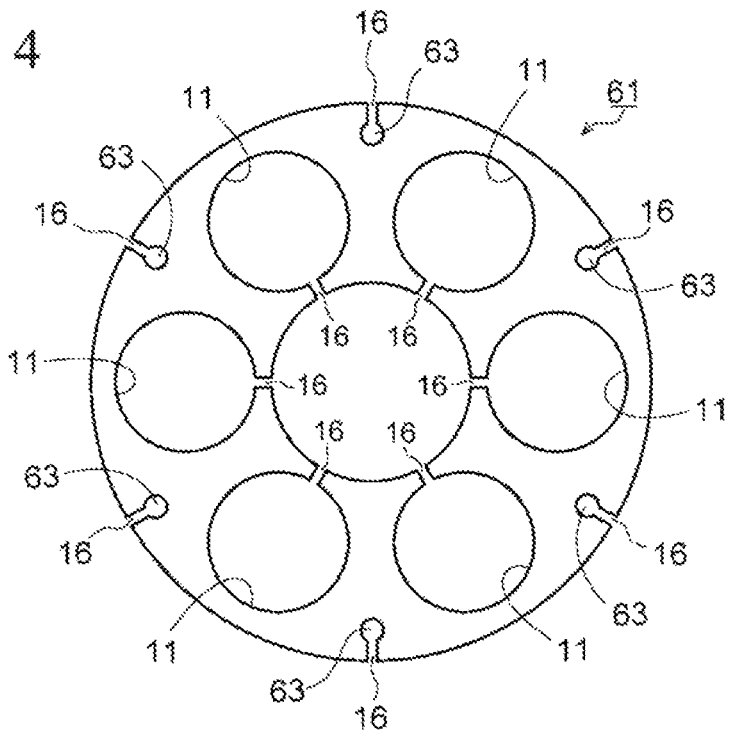
FIG. 4 is a plan view of a susceptor of a form other than the susceptors of FIGS. 1 and 3.

The shape of the notch 16 is not limited to that described above. For example, a susceptor 61 of FIG. 4 is provided with a circular hole 63 having a diameter greater than the notch width at the tip of the notch 16 provided at the outer periphery of the susceptor 51. In this way, it is possible to relax concentration of stress on the tip of the notch 16, thereby further suppressing fracture in the susceptor 61.

Although in the above-described embodiment, an example where a susceptor (hereinafter, the susceptor 5, the susceptor 51, and the susceptor 61 are collectively referred to as a susceptor) having six openings 11 for the substrate mounting parts 8 has been illustrated, in the invention, the number of openings 11 is not limited thereto. For example, ten openings 11 having a smaller diameter may be provided. In this case, the shape, number, and position of the notches 16 may be appropriately changed on the basis of the number or size of the openings 11.

Figure 5:
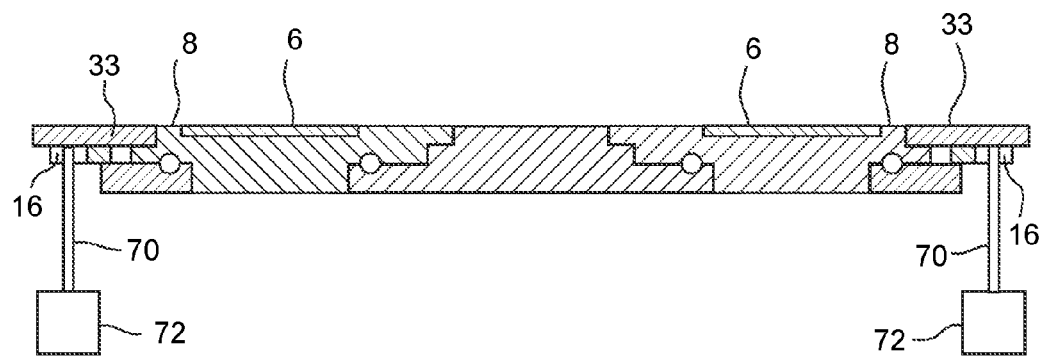
FIG. 5 is a sectional elevational view of selected portions of a vapor-phase growth apparatus according to an embodiment of the invention.

As shown in FIG. 5, a vapor-phase growth apparatus 1 may be provided with a plurality of thrust-up rods 70 which have an upright and elongated rod shape and have the tip provided concentrically to the notch 16 in plan view, and a plurality of elevation means 72 of the thrust-up rods which normally locate the tip of the thrust-up rod downward of the susceptor and moves up the thrust-up rod 70 upward of the upper surface of the susceptor during operation. In the following description, a plurality of thrust-up rods 70 and elevation means 72 are collectively referred to as a thrust-up mechanism.

Since the thrust-up mechanism has the above-described configuration, in a state where the susceptor is rotated to locate the notch 16 directly above the tip of the thrust-up rod 70, if the elevation means 72 is operated to move up the thrust-up rod 70, the thrust-up rod 70 is inserted into the notch 16, and thus only the susceptor cover 33 can be thrust up and supported.

In a state where the susceptor cover is thrust up, the lower surface of the susceptor cover 33 can be received by a fork or the like. In other words, even if the susceptor cover 33 is not thrust up from the susceptor, the susceptor cover 33 can be discharged.

With the discharging method of the thrust-up type, as in the discharging method which the susceptor cover is thrust up by the above-described arm or the like, it is not necessary to increase the diameter of the susceptor cover 33 to provide a protruding portion into which a fork or the like is hooked. Accordingly, the susceptor cover 33 can have the same diameter as the susceptor, and for this reason, a temperature distribution does not occur in the susceptor cover 33, and it is possible to prevent the occurrence of cracking. When manufacturing the susceptor cover 33, since it is possible to reduce materials to be cut, it is possible to achieve significant reduction in costs.

The thrust-up mechanism may be provided so as to pass through the circular hole 63, instead of the notch 16. Since the diameter of the circular hole 63 is greater than the width of the notch 16, it is possible to design a thrust-up rod to have a large diameter, and simply perform adjustment.

Although in the above description, an example where only the susceptor cover 33 is thrust up has been described, if the susceptor cover is thrust up in a state where the position of the notch 16 or the circular hole 63 is shifted from directly above the thrust-up rod, the susceptor together with the susceptor cover 33 can be thrust up. With this, similarly to the conveying method of the susceptor cover 33, the lower surface of the susceptor is supported by a fork or the like, thereby discharging the susceptor and the susceptor cover 33 simultaneously.

INDUSTRIAL APPLICABILITY

It is possible to provide a susceptor which has a substrate mounting part, on which a plurality of substrates are mounted, and in which there is no cracking due to a temperature distribution, and a vapor-phase growth apparatus having the susceptor.

DESCRIPTION OF THE REFERENCE SIGNS

1: Vapor-phase growth apparatus
3: Chamber
5: Susceptor
6: Substrate
7: Opening
8: Substrate mounting part
9: Rotating shaft
10: Heater
11: Opening
12: Raw material gas introduction portion
13: Ball
14: Exhaust portion
15: Ball bearing mechanism
16: Notch
17: Gear
21: Fixed gear
23: Pocket
33: Susceptor cover
51: Susceptor
61: Susceptor
63: Circular hole

The invention claimed is:

1. A susceptor which is rotatably provided in a chamber and has a plurality of substrate mounting parts, and a substrate on which a thin film is deposited is rotatably mounted on the substrate mounting part,
the susceptor has a disk-shape wherein there is an opening at an inner periphery of the susceptor, into which a rotating shaft to rotate the susceptor is inserted, and the susceptor has a plurality of notches extending in a radial direction at an outer periphery and/or a periphery of said opening, and a length of each of the notches is between 1 mm and 20 mm, the plurality of notches including at least a first plurality of notches that are provided at the outer periphery of the susceptor and that are located so as to communicate with corresponding openings for the plurality of substrate mounting parts.

2. The susceptor according to claim 1, wherein the plurality of notches also includes a second plurality of notches that are provided between the substrate mounting parts.

3. The susceptor according to claim 2, wherein the second plurality of notches are provided at the outer periphery of the susceptor, and a circular hole is provided in each of the second plurality of notches.

4. The susceptor according to claim 3, wherein the circular holes have a diameter that is greater than a width of the notches.

5. The susceptor according to claim 3, wherein the circular hole provided in each of the second plurality of notches is located at a radial inner end of the notch.

6. The susceptor according to claim 1, wherein the plurality of notches includes a the plurality of notches that are provided at the periphery of said opening.

7. The susceptor according to claim 6, wherein at least some of the third plurality of notches provided at the periphery of said opening are located so as to communicate said opening and corresponding openings for the plurality of substrate mounting parts.

8. A vapor-phase growth apparatus comprising the susceptor according to claim 1.

9. A vapor-phase growth apparatus comprising the susceptor according to claim 3, wherein the vapor-phase growth apparatus further comprises a susceptor cover provided on an upper surface of the susceptor, and a thrust-up mechanism having at least one thrust-up rod provided below the susceptor to be insertable into the circular hole and movable up and down, and the susceptor cover is able to be thrust up by the at least one thrust-up rod.

10. The vapor-phase growth apparatus of claim 9, wherein the susceptor cover overlies and covers the first plurality of notches provided at the outer periphery of the susceptor.

11. A susceptor which is rotatably provided in a chamber and has a plurality of substrate mounting parts, and a substrate on which a thin film is deposited is rotatably mounted on the substrate mounting part,
the susceptor has a disk-shape wherein there is an opening at an inner periphery of the susceptor, into which a rotating shaft to rotate the susceptor is inserted, and the susceptor has a plurality of notches extending in a radial direction at an outer periphery and/or a periphery of said opening, and a length of each of the notches is between 1 mm and 20 mm, wherein the plurality of notches are provided at the outer periphery of the susceptor, and where a circular hole is provided in each of the plurality of notches, the circular holes having a diameter that is greater than a width of the notches.

* * * * *